(12) United States Patent
Sato et al.

(10) Patent No.: US 7,429,341 B2
(45) Date of Patent: Sep. 30, 2008

(54) ELECTROCONDUCTIVE COMPOSITION, METHOD FOR PRODUCING ELECTROCONDUCTIVE FILM, AND ELECTROCONDUCTIVE FILM

(75) Inventors: Nao Sato, Kanagawa (JP); Kazunori Ishikawa, Kanagawa (JP); Atsushi Onozato, Kanagawa (JP); Hiroyuki Hosoda, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 0 days.

(21) Appl. No.: 11/733,836

(22) Filed: Apr. 11, 2007

(65) Prior Publication Data

US 2007/0235695 A1 Oct. 11, 2007

(30) Foreign Application Priority Data

Apr. 11, 2006 (JP) ............................. 2006-108751
May 26, 2006 (JP) ............................. 2006-146587

(51) Int. Cl.
*H01B 1/08* (2006.01)
*B05D 5/12* (2006.01)
(52) U.S. Cl. .................. 252/520.3; 427/123; 427/126.5
(58) Field of Classification Search ............... 252/514, 252/520.3; 427/58, 123, 126.5
See application file for complete search history.

(56) References Cited

U.S. PATENT DOCUMENTS

| 6,548,122 B1 * | 4/2003 | Sharma et al. ............... 427/559 |
| 6,878,184 B1 * | 4/2005 | Rockenberger et al. ....... 75/343 |
| 6,942,825 B2 | 9/2005 | Honda et al. |

FOREIGN PATENT DOCUMENTS

| JP | 7-331125 A | 12/1995 |
| JP | 9-92029 A | 4/1997 |
| JP | 2003-203522 A | 7/2003 |
| JP | 200649147A A | 2/2006 |

* cited by examiner

*Primary Examiner*—Mark Kopec
(74) *Attorney, Agent, or Firm*—Connolly Bove Lodge & Hutz LLP

(57) ABSTRACT

An electroconductive composition including (A) silver oxide; and (B) a secondary aliphatic acid silver salt produced by using a secondary aliphatic acid having a boiling point of not higher than 200° C. will be capable of forming an excellent electroconductive film in a short time on a substrate having a low heat resistance. An electroconductive composition including (A) silver oxide; (B') a secondary aliphatic acid silver salt whose secondary aliphatic acid contains up to 7 carbon atoms; (C1) a aliphatic acid containing at least 8 carbon atoms and/or (C2) a aliphatic acid silver salt whose aliphatic acid contains at least 8 carbon atoms; and (D) a solvent and/or a plasticizer has an excellent thixotropy and can be formed into an electroconductive film having a low electric resistance even after having been heated for a short time.

11 Claims, No Drawings

ELECTROCONDUCTIVE COMPOSITION, METHOD FOR PRODUCING ELECTROCONDUCTIVE FILM, AND ELECTROCONDUCTIVE FILM

The entire contents of documents cited in this specification are incorporated herein by reference.

BACKGROUND OF THE INVENTION

The present invention relates to an electroconductive composition, an electroconductive film-producing method, and an electroconductive film produced thereby.

Various methods have been used in producing a circuit board. In one known method, an electroconductive composition is printed on a synthetic resin substrate such as a polyester film, for example, by screen printing to thereby form a predetermined circuit pattern, and an electroconductive film constituting the electroconductive circuit is formed by heat treating the printed circuit pattern. The electroconductive composition used in this method is, for example, a silver paste produced by adding a binder made of a thermoplastic resin such as acrylic resin or vinyl acetate resin or a thermosetting resin such as epoxy resin or unsaturated polyester resin, an organic solvent, a curing agent, a catalyst, and the like to electroconductive particles such as silver particles, and kneading the mixture to prepare the silver paste.

For example, JP 07-331125 A discloses "an electroconductive paste comprising 100 parts by weight of an electroconductive powder containing a powder of a copper alloy which is represented by the general formula $Ag_xCu_y$ ($0.001 \leq x \leq 0.4$, $0.6 \leq y \leq 0.999$ (atomic ratio)) and in which the silver concentration on the surface of the particles is higher than the average silver concentration of the particles, the average particle diameter is in the range of 1 to 10 μm, and the fine particles having a particle size of 0.1 to 1 μm account for 5 to 80% by weight of all particles; and 10 to 40 parts by weight of a binder resin containing a thermosetting phenol resin having a weight average molecular weight of 300 to 4000 and a molar ratio of formaldehyde/phenol of 0.8 to 2".

JP 09-92029 A discloses "an electroconductive paste which uses an electroconductive metal powder and an epoxy resin which serves as a binder for the metal powder".

JP 2003-203522 A discloses "a silver compound paste containing silver oxide particles and a tertiary aliphatic acid silver salt".

SUMMARY OF THE INVENTION

However, the inventors of the present invention found that the films obtained by using the electroconductive pastes described in JP 07-331125 A and JP 09-92029 suffer from the problem of high electric resistance.

The inventors also found that use of the silver compound paste described in JP 2003-203522 A is associated with the problem that the heat treatment conducted in the production of the electroconductive film takes a long time (about 30 minutes to 1 hour), and this leads to the difficulty of forming an electroconductive film on a substrate having a low heat resistance (for example, a film of polyethylene terephthalate (PET)). In addition, this paste suffered from the problem of low productivity of the electroconductive film due to such long heat treatment.

In view of the situation as described above, a first object of the present invention is to provide an electroconductive composition which ensures formation of an electroconductive film in a short time and which enables convenient formation of an electroconductive film on a substrate having a low heat resistance, an electroconductive film-producing method which uses such electroconductive composition, and an electroconductive film produced by using such electroconductive composition.

A second object of the present invention is to provide an electroconductive composition which has improved thixotropy, and which can be formed into an electroconductive film having a low electric resistance in a short heat treatment, an electroconductive film-producing method which uses such electroconductive composition, and an electroconductive film having a low electric resistance.

The inventors of the present invention conducted an intensive study to attain the first object, and found that an electroconductive composition which uses silver oxide and a secondary aliphatic acid silver salt prepared by using a secondary aliphatic acid having a boiling point of not higher than 200° C. is capable of forming an excellent electroconductive film in a short time on a substrate having a low heat resistance as well.

The inventors of the present invention also conducted an intensive study to attain the second object, and found that a composition containing silver oxide, a particular secondary aliphatic acid silver salt, a particular aliphatic acid and/or a aliphatic acid silver salt, and a solvent and/or a plasticizer has an improved thixotropy, and this composition can be formed into an electroconductive film having a low electric resistance in a short heat treatment.

The inventors of the present invention completed the present invention on the bases of such findings.

Accordingly, the present invention provides the following (1) to (10).

(1) An electroconductive composition comprising:
  (A) silver oxide; and
  (B) a secondary aliphatic acid silver salt produced by using a secondary aliphatic acid having a boiling point of not higher than 200° C.

(2) The electroconductive composition according to (1) above, wherein a ratio of a number of moles A of the silver oxide (A) to a number of moles B of the secondary aliphatic acid silver salt (B) (molar ratio A/B) is in a range of 2/1 to 15/1.

(3) The electroconductive composition according to (1) or (2) above, wherein the secondary aliphatic acid silver salt (B) is silver 2-methylpropanoate.

(4) An electroconductive composition comprising:
  (A) silver oxide;
  (B') a secondary aliphatic acid silver salt whose secondary aliphatic acid contains up to 7 carbon atoms;
  (C1) a aliphatic acid containing at least 8 carbon atoms, and/or (C2) a aliphatic acid silver salt whose aliphatic acid contains at least 8 carbon atoms; and
  (D) a solvent and/or a plasticizer.

(5) The electroconductive composition according to (4) above, wherein a ratio of a total weight of the silver oxide (A) and the secondary aliphatic acid silver salt whose secondary aliphatic acid contains up to 7 carbon atoms (B') to a weight of the aliphatic acid containing at least 8 carbon atoms (C1) and/or the aliphatic acid silver salt (C2) whose aliphatic acid contains at least 8 carbon atoms is in a range of 100/0.5 to 100/20.

(6) The electroconductive composition according to (4) or (5) above, wherein the secondary aliphatic acid silver salt whose secondary aliphatic acid contains up to 7 carbon atoms (B') is silver 2-methylpropanoate.

(7) The electroconductive composition according to any one of (4) to (6) above, wherein the solvent (D) is α-terpineol.

(8) An electroconductive film-producing method comprising the steps of:

applying the electroconductive composition of any one of (1) to (7) above onto a substrate to form a coating; and subjecting the coating to a heat treatment to produce an electroconductive film.

(9) The electroconductive film-producing method according to (8) above, wherein the heat treatment is conducted by heating the coating to a temperature of 100 to 250° C.

(10) An electroconductive film formed by the electroconductive film-producing method of (8) or (9) above.

As will be demonstrated below, a first aspect of the present invention will provide an electroconductive composition which is capable of forming an excellent electroconductive film in a short time on a substrate having a low heat resistance; an electroconductive film-producing method which uses such electroconductive composition; and an electroconductive film produced by using such electroconductive composition.

Use of the electroconductive composition according to the first aspect of the present invention is extremely useful since it enables convenient production of an electric circuit, a circuit for an antenna, and the like on a substrate having a low heat resistance as well in a short time.

The electroconductive composition according to a second aspect of the present invention has an excellent thixotropy and can be formed into an electroconductive film having a low electric resistance even after having been heated for a short time.

In addition, the electroconductive film-producing method according to the second aspect of the present invention enables production of an electroconductive film having a low electric resistance.

DETAILED DESCRIPTION OF THE INVENTION

The electroconductive composition according to the first aspect of the present invention is an electroconductive composition containing silver oxide (A) and a secondary aliphatic acid silver salt (B) produced by using a secondary aliphatic acid having a boiling point of not higher than 200° C.

First, the silver oxide (A) and the secondary aliphatic acid silver salt (B) are described.

The silver oxide (A) used in the electroconductive composition according to the first aspect of the present invention is silver(I) oxide, namely, $Ag_2O$.

In the present invention, the silver oxide (A) used may be in any form, and preferably, in the form of particles having a particle size of up to 10 μm, and more preferably up to 1 μm. When the particle size is within such range, self-reduction reaction occurs at a lower temperature, and as a consequence, an electroconductive film can be produced at a lower temperature.

The secondary aliphatic acid silver salt (B) used in the electroconductive composition according to the first aspect of the present invention is the one obtained by using a secondary aliphatic acid having a boiling point of not higher than 200° C., and in particular, the one obtained by reacting the secondary aliphatic acid having a boiling point of not higher than 200° C. as described below with silver oxide.

The secondary aliphatic acid used in producing the secondary aliphatic acid silver salt (B) is not particularly limited as long as it is a secondary aliphatic acid having a boiling point of not higher than 200° C., and examples include those represented by the following formula (1):

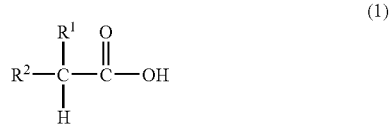

wherein $R^1$ represents an alkyl group containing 1 to 6 carbon atoms, and $R^2$ represents an alkyl group containing 1 to 10 carbon atoms.

Exemplary alkyl groups containing 1 to 6 carbon atoms in $R^1$ of the formula (1) include methyl group, ethyl group, n-propyl group, n-butyl group, n-pentyl group, and n-hexyl group, and $R^1$ is preferably methyl group or ethyl group.

Exemplary alkyl groups containing 1 to 10 carbon atoms in $R^2$ of the formula (1) include the alkyl groups containing 1 to 6 carbon atoms of $R^1$, and n-heptyl group, n-octyl group, n-nonyl group, and n-decyl group, and $R^2$ is preferably methyl group, ethyl group, or n-propyl group.

In the present invention, exemplary carboxylic acids represented by the formula (1) include 2-methylpropanoic acid (also referred to as isobutyric acid), 2-methylbutanoic acid (also referred to as 2-methylbutyric acid), 2-methylpentanoic acid, 2-methylheptanoic acid, and 2-ethylbutanoic acid; and unsaturated secondary aliphatic acids such as acrylic acid.

Among these, the preferred is 2-methylpropanoic acid because the time required for producing an electroconductive film from the electroconductive composition according to the first aspect of the present invention containing silver 2-methylpropanoate, which is the secondary aliphatic acid silver salt (B), would be reduced (for example, to several seconds at a temperature around 180° C.).

On the other hand, the silver oxide used in producing the secondary aliphatic acid silver salt (B) is silver(I) oxide, namely, $Ag_2O$ as in the case of the silver oxide (A) used in the electroconductive composition according to the first aspect of the present invention.

The secondary aliphatic acid silver salt (B) used in producing the electroconductive composition according to the first aspect of the present invention is obtained by reacting the secondary aliphatic acid having a boiling point of not higher than 200° C. with silver oxide.

This reaction is not particularly limited as long as the reaction represented by the following scheme (2):

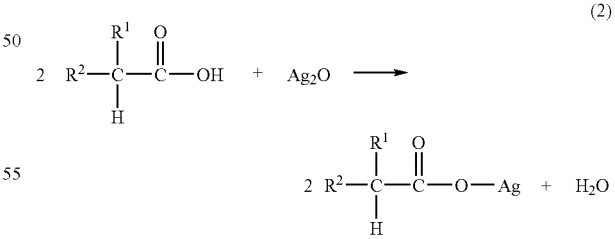

(in the reaction scheme (2), $R^1$ and $R^2$ are as defined above) is involved, and preferred methods include the one in which the reaction of the secondary aliphatic acid with the silver oxide is allowed to proceed while the silver oxide is pulverized and the one conducted after pulverizing the silver oxide. In an exemplary process of the former method, the silver oxide and a solution of the secondary aliphatic acid in a solvent are kneaded in a ball mill or the like so that the reaction proceeds at room temperature for about 1 to 24 hours, and preferably 2 to 8 hours while the solid silver oxide is pulverized.

Exemplary solvents used for preparing the solution of the secondary aliphatic acid include butyl carbitol, methyl ethyl ketone, isophorone, and α-terpineol. These may be used alone or in combination of two or more.

Among these, use of isophorone and/or α-terpineol for the solvent is preferable in view of the improved thixotropy of the electroconductive composition according to the first aspect of the present invention which contains the secondary aliphatic acid silver salt (B) obtained by the reaction as described above.

Since the secondary aliphatic acid silver salt (B) as described above is used in the present invention, the time required for the production of the electroconductive film is reduced, and the electroconductive film can be formed, for example, in about several seconds to 1 minute at a temperature of about 180° C., and an excellent electroconductive film can also be formed on a substrate having a poor heat resistance. This is believed to be due to the fact that the secondary aliphatic acid silver salt (B) is more likely to be decomposed by the heat treatment to generate silver, and the secondary aliphatic acid or the decomposition product resulting from such decomposition is more volatile. The results of thermogravimetric analysis (TGA) also indicate that the secondary aliphatic acid silver salt (B) is more easily reduced than a tertiary aliphatic acid silver salt.

The electroconductive composition according to the first aspect of the present invention is a composition containing the above-mentioned silver oxide (A) and secondary aliphatic acid silver salt (B), and the ratio of the number of moles A of the silver oxide (A) to the number of moles B of the secondary aliphatic acid silver salt (B) (molar ratio A/B) is preferably in the range of 2/1 to 15/1. When the molar ratio is within such range, the electroconductive film produced by using the resulting electroconductive composition will have a reduced resistivity.

The electroconductive composition according to the first aspect of the present invention may optionally contain an additive such as metal powder or a reducing agent.

Examples of such metal powder include copper, silver, and aluminum, and among these, the preferred are copper and silver. The metal powder may preferably have a particle diameter of 0.01 to 10 μm.

Exemplary reducing agents include ethylene glycols.

For the purpose of improving the adhesion, the electroconductive composition according to the first aspect of the present invention may also contain, in addition to the secondary aliphatic acid silver salt (B), another aliphatic acid silver salt such as silver neodecanoate in a smaller molar content than the secondary aliphatic acid silver salt (B).

The method used for producing the electroconductive composition according to the first aspect of the present invention is not particularly limited, and in an exemplary method, the silver oxide (A), the secondary aliphatic acid silver salt (B), and optional additives are mixed in a roll mill, kneader, extruder, universal agitator, or the like.

In the present invention, the silver oxide used in producing the secondary aliphatic acid silver salt (B) may be the same as the silver oxide (A) as described above, and therefore, the method used for producing the electroconductive composition according to the first aspect of the present invention is not limited to the method of mixing the preliminarily prepared secondary aliphatic acid silver salt (B) with the silver oxide (A), and also applicable is the method in which an excess amount of the silver oxide (A) is mixed with the secondary aliphatic acid which is used for producing the secondary aliphatic acid silver salt (B) so that the secondary aliphatic acid silver salt (B) is prepared during the mixing process.

The electroconductive film-producing method according to the first aspect of the present invention is a method comprising an application step in which the electroconductive composition according to the first aspect of the present invention is applied onto a substrate to form a coating, and a heat treatment step in which the coating is subjected to a heat treatment to produce an electroconductive film.

Next, the application step and the heat treatment step are described in detail.

The application step is a step of applying the electroconductive composition according to the first aspect of the present invention onto the substrate to thereby form the coating.

The substrate used may be the substrate having a low heat resistance as mentioned above, or alternatively, a film of polyethylene naphthalate, polyimide, or the like; a copper plate, a copper foil, a substrate made of glass or epoxy resin.

The electroconductive composition according to the first aspect of the present invention is applied onto the substrate by the application method as will be described below after the composition is optionally dissolved in a solvent such as α-terpineol as mentioned above to thereby form the coating.

Examples of the application method that may be used include ink jet printing, screen printing, gravure printing, offset printing, and relief printing.

The heat treatment step is a step in which the coating formed in the application step is heat treated to produce the electroconductive film.

In the present invention, when the coating is heat treated, the secondary aliphatic acid silver salt (B) is decomposed to generate silver, and while most of the secondary aliphatic acid or its decomposition product volatilizes, some of the secondary aliphatic acid generated by the decomposition reacts with the silver oxide (A) to again generate the secondary aliphatic acid silver salt (B), and this secondary aliphatic acid silver salt (B) is reduced (namely, decomposed into the silver and the secondary aliphatic acid) in the next cycle. The electroconductive film according to the first aspect of the present invention (silver film) is formed by the repetition of such cycle.

In the heat treatment, the upper limit of the temperature at which the coating is treated is preferably up to 250° C., more preferably up to 220° C., still more preferably up to 190° C., and most preferably up to 185° C.

The lower limit of the temperature at which the coating is treated is preferably at least 100° C., more preferably at least 130° C., and most preferably at least 150° C.

When the temperature in the heat treatment is in such range, an excellent electroconductive film can be formed on a substrate having poor heat resistance, and as described above, this merit is realized by the use of the secondary aliphatic acid silver salt (B) in the electroconductive composition according to the first aspect of the present invention.

In the present invention, the coating formed in the application step can also be converted to the electroconductive film through the cycle as described above by irradiating the coating with UV or infrared light, and therefore, the heat treatment may also be conducted by such UV or infrared irradiation.

The electroconductive film according to the first aspect of the present invention is a film obtained by the electroconductive film-producing method according to the first aspect of the present invention.

The electroconductive film according to the first aspect of the present invention preferably has a volume resistivity of up to $12\times10^{-6}$ Ω·cm, and more preferably $10\times10^{-6}$ to $5\times10^{-6}$ Ω·cm when the film is the one heat treated at 180° C. for 1 minute.

Typical applications of the electroconductive film according to the first aspect of the present invention include an electronic circuit and a circuit of an antenna.

Next, the second aspect of the present invention is described in detail.

The electroconductive composition according to the second aspect of the present invention is an electroconductive composition comprising silver oxide (A), a secondary aliphatic acid silver salt (B') whose secondary aliphatic acid contains up to 7 carbon atoms, a aliphatic acid containing at least 8 carbon atoms (C1) and/or a aliphatic acid silver salt (C2) whose aliphatic acid contains at least 8 carbon atoms, and a solvent and/or a plasticizer (D).

The silver oxide (A) in the electroconductive composition according to the second aspect of the present invention is the same as the silver oxide (A) used in the electroconductive composition according to the first aspect of the present invention.

In the secondary aliphatic acid silver salt (B') in the electroconductive composition according to the second aspect of the present invention, the secondary aliphatic acid contains up to 7 carbon atoms. The secondary aliphatic acid silver salt (B') may have an unsaturated bond.

A typical secondary aliphatic acid silver salt (B') is the one represented by the following formula (3):

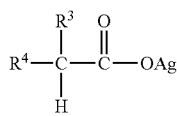

(3)

wherein $R^3$ and $R^4$ are independently an alkyl group containing 1 to 3 carbon atoms, with the proviso that the sum of the number of carbon atoms in the $R^3$ and the number of carbon atoms in the $R^4$ is up to 5. The alkyl group may be branched.

Exemplary alkyl groups containing 1 to 3 carbon atoms include methyl group, ethyl group, n-propyl group, and isopropyl groups.

$R^3$ is preferably methyl group or ethyl group.

$R^4$ is preferably methyl group, ethyl group, or n-propyl group.

Examples of the secondary aliphatic acid silver salt (B') include silver 2-methylpropanoate (also referred to as silver isobutyrate), silver 2-methylbutanoate (also referred to as silver 2-methylbutyrate), silver 2-methylpentanoate, silver 2-ethylbutanoate, and silver acrylate.

Among these, the preferred is silver 2-methylpropanoate because the electroconductive film formed from the resulting composition has a reduced electric resistance although the time required for the production of the electroconductive film is as short as (for example, about 5 to 60 seconds at a temperature of about 180° C.).

The secondary aliphatic acid silver salts (B') as mentioned above may be used either alone or in combination of two or more.

There is no particular limitation on the production method of the secondary aliphatic acid silver salt (B'), and it may be produced, for example, by reacting a secondary aliphatic acid containing up to 7 carbon atoms and silver oxide.

The secondary aliphatic acid used in producing the secondary aliphatic acid silver salt (B') is not particularly limited as long as it is a secondary aliphatic acid containing up to 7 carbon atoms, and it may contain an unsaturated bond.

An exemplary secondary aliphatic acid containing up to 7 carbon atoms includes the one represented by the following formula (2):

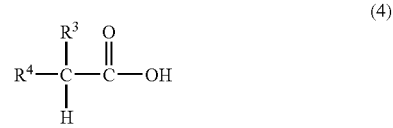

(4)

wherein $R^3$ and $R^4$ are as defined above.

Exemplary secondary aliphatic acids include saturated secondary aliphatic acids such as 2-methylpropanoic acid (also referred to as isobutyric acid), 2-methylbutanoic acid (also referred to as 2-methylbutyric acid), 2-methylpentanoic acid, and 2-ethylbutanoic acid, and unsaturated secondary aliphatic acids such as acrylic acid.

On the other hand, the silver oxide used in producing the secondary aliphatic acid silver salt (B') is the same as the silver oxide (A) used in the electroconductive composition according to the second aspect of the present invention.

The reaction of the secondary aliphatic acid containing up to 7 carbon atoms and the silver oxide is not particularly limited as long as the reaction represented by the following scheme (5) is involved.

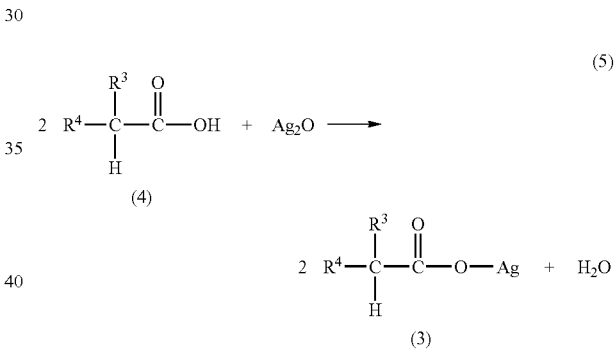

(5)

Preferred methods that may be used for producing the secondary aliphatic acid silver salt (B') include the one in which the reaction of the secondary aliphatic acid with the silver oxide is allowed to proceed while the silver oxide is pulverized and the one conducted after pulverizing the silver oxide. In an exemplary process of the former method, the silver oxide and a solution of the secondary aliphatic acid in a solvent are kneaded in a ball mill or the like so that the reaction proceeds at room temperature for about 1 to 24 hours, and preferably 2 to 8 hours while the solid silver oxide is pulverized.

Exemplary solvents used for preparing the solution of the secondary aliphatic acid include butyl carbitol, methyl ethyl ketone, isophorone, and α-terpineol.

These solvents may be used either alone or in combination of two or more.

Among these, use of isophorone and/or α-terpineol for the solvent is preferable in view of the improved thixotropy of the electroconductive composition according to the second aspect of the present invention which contains the secondary aliphatic acid silver salt (B') obtained.

The secondary aliphatic acid silver salt (B') is generally included in the secondary aliphatic acid silver salt (B)

obtained by using the secondary aliphatic acid having a boiling point of not higher than 200° C. which is used in the electroconductive composition according to the first aspect of the present invention.

In the electroconductive composition according to the second aspect of the present invention, the molar ratio of the silver oxide (A) to the secondary aliphatic acid silver salt (B') is preferably 2/1 to 15/1, and more preferably 1/1 to 10/1 in terms of the molar ratio (A/B) of the number of moles A of the silver oxide (A) to the number of moles B of the secondary aliphatic acid silver salt (B'). When the molar ratio is within such range, the electroconductive film produced by using the resulting electroconductive composition will have a reduced electric resistance.

Next, the aliphatic acid containing at least 8 carbon atoms (C1) is described.

The aliphatic acid (C1) included in the electroconductive composition according to the second aspect of the present invention is a aliphatic acid containing at least 8 carbon atoms.

The aliphatic acid (C1) is a chain molecule which may be linear or branched, and it may contain an unsaturated bond.

The aliphatic acid (C1) contains at least 8 carbon atoms, and in view of realizing improved thixotropy, the aliphatic acid (C1) may preferably contain 8 to 22 carbon atoms, and more preferably, 10 to 18 carbon atoms.

The aliphatic acid containing at least 8 carbon atoms (C1) is represented by $R^5—(COOH)_m$ wherein $R^5$ is an aliphatic hydrocarbon group containing at least 2 carbon atoms, and m is an integer of at least 1 with the proviso that the sum of the number of carbon atoms in the $R^5$ and m is at least 8.

m is preferably an integer of 1 to 4.

The number of carbon atoms in the aliphatic hydrocarbon group of $R^5$ is at least 2, preferably at least 4, more preferably 4 to 21, and still more preferably 6 to 21.

The aliphatic hydrocarbon group containing at least two carbon atoms is not particularly limited. The aliphatic hydrocarbon group is a chain molecule which may be linear or branched, and it may contain an unsaturated bond.

Examples of the aliphatic hydrocarbon group containing at least 2 carbon atoms include ethyl group, propyl group, butyl group, pentyl group, n-heptyl group, n-octyl group, n-nonyl group, n-decyl group, n-undecyl group, n-dodecyl group, n-tridecyl group, n-tetradecyl group, n-pentadecyl group, and n-hexadecyl group.

Examples of the aliphatic acid (C1) include monocarboxylic acid-containing saturated aliphatic hydrocarbon compounds such as caprylic acid (containing 8 carbon atoms, and in this paragraph, the number in [ ] indicates the number of carbon atoms in the aliphatic acid), capric acid [10], lauric acid [12], myristic acid [14], palmitic acid [16], and stearic acid [18]; polycarboxylic acid-containing saturated aliphatic hydrocarbon compounds such as a compound represented by the following formula (6):

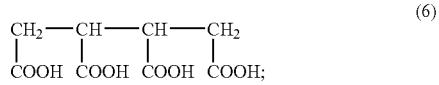

(6)

and unsaturated aliphatic acids such as oleic acid [18], linoleic acid [18], linolenic acid [18], arachidonic acid [20], eicosapentaenoic acid [20], and docosahexaenoic acid [22].

Among these, the preferred are the monocarboxylic acid-containing saturated aliphatic hydrocarbon compounds, the polycarboxylic acid-containing saturated aliphatic hydrocarbon compounds, and the more preferred are capric acid, lauric acid, myristic acid, palmitic acid, stearic acid, and the compound represented by the formula (6) in view of the improved thixotropy.

Next, the aliphatic acid silver salt (C2) whose aliphatic acid contains at least 8 carbon atoms is described.

The aliphatic acid silver salt (C2) included in the electroconductive composition according to the second aspect of the present invention is the one using the aliphatic acid containing at least 8 carbon atoms.

The aliphatic acid silver salt (C2) is a chain molecule which may be linear or branched, and it may contain an unsaturated bond.

The aliphatic acid in the silver salt (C2) contains at least 8 carbon atoms, and in view of realizing improved thixotropy, the aliphatic acid in the silver salt (C2) may preferably contain 8 to 22 carbon atoms, and more preferably, 10 to 18 carbon atoms.

The aliphatic acid silver salt (C2) is represented by $R_6—(COOAg)_n$ wherein $R^6$ is an aliphatic hydrocarbon group containing at least 2 carbon atoms, and n is an integer of at least 1 with the proviso that the sum of the number of carbon atoms in the $R^6$ and n is at least 8.

n is preferably an integer of 1 to 4.

The number of carbon atoms in the aliphatic hydrocarbon group of $R^6$ is at least 2, preferably at least 4, more preferably 4 to 21, and still more preferably 6 to 21.

The aliphatic hydrocarbon group containing two or more carbon atoms is not particularly limited, and may be the same as the one described above.

Examples of the aliphatic acid silver salt (C2) whose aliphatic acid contains at least 8 carbon atoms include silver salts of monocarboxylic acid-containing saturated aliphatic hydrocarbon compounds such as silver caprylate, silver caprate, silver laurate, silver myristate, silver palmitate, and silver stearate; silver salts of polycarboxylic acid-containing saturated aliphatic hydrocarbon compounds such as silver salt of the compound represented by the formula (6); and silver salts of unsaturated aliphatic acids such as silver oleate, silver linolate, silver linolenate, silver arachidonate, silver eicosapentaenoate, and silver docosahexaenoate.

Among these, the preferred are silver salts of monocarboxylic acid-containing saturated aliphatic hydrocarbon compounds; silver salts of polycarboxylic acid-containing saturated aliphatic hydrocarbon compounds; and the more preferred are silver caprate; silver laurate; silver myristate; silver palmitate; silver stearate; and silver salt of the compound represented by the formula (6) in view of the improved thixotropy.

There is no particular limitation on the production method of the aliphatic acid silver salt (C2) whose aliphatic acid contains at least 8 carbon atoms, and in an exemplary method, a aliphatic acid containing at least 8 carbon atoms can be reacted with silver oxide to obtain the aliphatic acid silver salt (C2) whose aliphatic acid contains at least 8 carbon atoms.

The aliphatic acid containing at least 8 carbon atoms used in producing the aliphatic acid silver salt (C2) whose aliphatic acid contains at least 8 carbon atoms is not particularly limited as long as it is a aliphatic acid containing at least 8 carbon atoms.

The aliphatic acid containing at least 8 carbon atoms is the same as the one described above.

On the other hand, the silver oxide used in producing the aliphatic acid silver salt (C2) whose aliphatic acid contains at least 8 carbon atoms is the same as the silver oxide included in the electroconductive composition according to the second aspect of the present invention.

The aliphatic acid silver salt (C2) whose aliphatic acid contains at least 8 carbon atoms may be produced by using the aliphatic acid containing at least 8 carbon atoms and the silver oxide by the same procedure as described above.

The aliphatic acid containing at least 8 carbon atoms (C1) and the aliphatic acid silver salt (C2) whose aliphatic acid contains at least 8 carbon atoms may be used, respectively, alone or in combination of two or more.

Among these, the preferred are at least two members selected from the group consisting of the aliphatic acids containing at least 8 carbon atoms (C1) and the aliphatic acid silver salts (C2) whose aliphatic acids contain at least 8 carbon atoms, and the more preferred are at least two members of the aliphatic acids containing at least 8 carbon atoms (C1), and the still more preferred are the combination of stearic acid and lauric acid in view of the improved thixotropy and the reduced electric resistance of the resulting film.

The aliphatic acid containing at least 8 carbon atoms (C1) and/or the aliphatic acid silver salt (C2) whose aliphatic acid contains at least 8 carbon atoms is preferably used in an amount of up to 20 parts by weight, and more preferably 0.5 to 15 parts by weight in relation to 100 parts by weight of the total of the silver oxide (A) and the secondary aliphatic acid silver salt (B') in view of the reduced electric resistance of the resulting film.

The aliphatic acid containing at least 8 carbon atoms (C1) and/or the aliphatic acid silver salt (C2) whose aliphatic acid contains at least 8 carbon atoms is preferably used so that the ratio of the total weight of the silver oxide (A) and the secondary aliphatic acid silver salt (B') to the weight of the aliphatic acid containing at least 8 carbon atoms (C1) and/or the aliphatic acid silver salt (C2) whose aliphatic acid contains at least 8 carbon atoms [(silver oxide (A)+secondary aliphatic acid silver salt (B'))/(aliphatic acid containing at least 8 carbon atoms (C1) and/or aliphatic acid silver salt (C2) whose aliphatic acid contains at least 8 carbon atoms)] is 100/0.5 to 100/20, and more preferably 100/0.5 to 100/15 in view of the reduced electric resistance of the resulting film and the improved thixotropy of the ink.

Next, the solvent and/or the plasticizer (D) is described.

The solvent and/or the plasticizer (D) in the electroconductive composition according to the second aspect of the present invention is not particularly limited as long as it can dissolve the aliphatic acid and/or the aliphatic acid silver salt as described above.

Exemplary such solvents and/or plasticizers include butyl carbitol, methyl ethyl ketone, isophorone, and α-terpineol.

The preferred is α-terpineol in view of the reduced electric resistance of the resulting film.

The solvent and/or the plasticizer (D) may be a single solvent and/or a single plasticizer or a combination of two or more solvents and/or a combination of two or more plasticizers.

The solvent and/or the plasticizer (D) is preferably used in an amount of 20 to 50 parts by weight, and more preferably 25 to 40 parts by weight in relation to 100 parts by weight of the silver oxide (A) in view of the improved thixotropy and reduced electric resistance of the resulting film.

The electroconductive composition according to the second aspect of the present invention may optionally contain an additive such as metal powder or a reducing agent.

Examples of such metal powder include copper, silver, and aluminum, and among these, the preferred are copper and silver. The metal powder may preferably have a particle diameter of 0.01 to 10 μm.

Exemplary reducing agents include ethylene glycols.

The method used for producing the electroconductive composition according to the second aspect of the present invention is not particularly limited, and in an exemplary method, the silver oxide (A), the secondary aliphatic acid silver salt (B'), the aliphatic acid (C1) and/or the aliphatic acid silver salt (C2), the solvent and/or the plasticizer (D), and the optional additives are mixed in a roll mill, kneader, extruder, universal agitator, or the like.

In the electroconductive composition according to the second aspect of the present invention, the silver oxide used in producing the secondary aliphatic acid silver salt (B') may be the same as the silver oxide (A) in the electroconductive composition according to the second aspect of the present invention, and therefore, the method used for producing the electroconductive composition of the present invention is not limited to the method of including the preliminarily prepared secondary aliphatic acid silver salt (B') in the starting material, and also applicable is the method in which the silver oxide and the secondary aliphatic acid are reacted in the reaction system to form the secondary aliphatic acid silver salt (B') so that the secondary aliphatic acid silver salt (B') is present in the electroconductive composition.

The same holds true for the aliphatic acid silver salt (C2) whose aliphatic acid contains at least 8 carbon atoms.

The electroconductive composition according to the second aspect of the present invention preferably has a thixotropic index (viscosity at 1 rpm/viscosity at 10 rpm) of at least 4.0, and more preferably 5.0 to 20 when measured under the condition of 23° C. and 65% RH (relative humidity) using a model E viscometer with a cone angle of 3°.

Typical applications of the electroconductive composition according to the second aspect of the present invention include an ink used for producing an electronic circuit or a circuit for an antenna on the substrate.

Since the electroconductive composition according to the second aspect of the present invention contains the secondary aliphatic acid silver salt (B'), the electroconductive film formed has a reduced electric resistance and the time required for the formation of the electroconductive film is reduced, and the electroconductive film can be formed, for example, in about several seconds to 1 minute at a temperature of about 180° C., and an excellent electroconductive film can also be formed on a substrate having a poor heat resistance. This is believed to be due to the fact that the secondary aliphatic acid silver salt (B') is more likely to be decomposed by the heat treatment to generate silver, and the secondary aliphatic acid or the decomposition product resulting from such decomposition is more volatile. The results of thermogravimetric analysis (TGA) also indicate that the secondary aliphatic acid silver salt (B') is more easily reduced than a tertiary aliphatic acid silver salt.

In addition, the electroconductive composition according to the second aspect of the present invention has excellent thixotropy since it contains the aliphatic acid containing at least 8 carbon atoms (C1) and/or the aliphatic acid silver salt (C2) whose aliphatic acid contains at least 8 carbon atoms. The inventors of the present invention estimate that the aliphatic acid containing at least 8 carbon atoms (C1) and/or the aliphatic acid silver salt (C2) whose aliphatic acid contains at least 8 carbon atoms which is highly compatible with the solvent and/or the plasticizer (D) functions as a dispersion medium for the silver oxide in the reaction system, thus imparting the thixotropy to the composition.

As described above, the electroconductive composition according to the second aspect of the present invention realizes the reduced electric resistance of the film simultaneously with the improved thixotropy in good balance.

When the electroconductive composition according to the second aspect of the present invention is used for ink, the film thickness is easy to control during printing, fine lines can be printed with high accuracy, smudging is prevented, and the ink smoothly comes off the plate and has good printability.

The electroconductive film-producing method according to the second aspect of the present invention is a method comprising an application step in which the electroconductive composition according to the second aspect of the present invention is applied onto a substrate to form a coating, and a heat treatment step in which the coating is subjected to a heat treatment to produce an electroconductive film.

Next, the application step and the heat treatment step are described in detail.

The application step is a step of applying the electroconductive composition according to the second aspect of the present invention onto the substrate to thereby form the coating.

The substrate used may be a film of polyethylene terephthalate (PET), polyethylene naphthalate, polyimide, or the like, a copper plate, a copper foil, or a substrate made of glass or epoxy resin.

The electroconductive composition according to the second aspect of the present invention may be applied onto the substrate by ink jet printing, screen printing, gravure printing, offset printing, relief printing or other application method to thereby form the coating.

The heat treatment step is a step in which the coating formed in the application step is heat treated to produce the electroconductive film.

In the heat treatment step, the coating is heat treated to produce the electroconductive film, and the coated substrate is thereby used as a substrate having an electroconductive film.

In the heat treatment step, the upper limit of the temperature at which the coating is treated is preferably up to 250° C., more preferably up to 220° C., still more preferably up to 190° C., and most preferably up to 185° C.

The lower limit of the temperature at which the coating is treated is preferably at least 100° C., more preferably at least 130° C., and most preferably at least 150° C.

When the temperature in the heat treatment is in such range, an excellent electroconductive film can be formed on a substrate having poor heat resistance, and this merit is realized by the use of the secondary aliphatic acid silver salt (B') in the electroconductive composition according to the second aspect of the present invention.

In the method of producing the electroconductive film according to the second aspect of the present invention, the coating formed in the application step can also be converted to the electroconductive film by irradiating the coating with UV or infrared light, and therefore, the heat treatment may also be conducted by such UV or infrared irradiation.

In the method of producing the electroconductive film according to the second aspect of the present invention, the secondary aliphatic acid silver salt (B') and the aliphatic acid silver salt (C2) whose aliphatic acid contains at least 8 carbon atoms which are both included in the coating are decomposed by the heat treatment of the coating to generate silver, the secondary aliphatic acid, and the aliphatic acid containing at least 8 carbon atoms or decomposition products thereof. Some of the secondary aliphatic acid and the aliphatic acid containing at least 8 carbon atoms or the decomposition products thereof are volatilized. In the meanwhile, some of the secondary aliphatic acid and the aliphatic acid containing at least 8 carbon atoms react with the silver oxide (A) to again form the secondary aliphatic acid silver salt (B') and the aliphatic acid silver salt (C2) whose aliphatic acid contains at least 8 carbon atoms, which generate the silver when they are reduced. Efficient generation of the silver in the system is realized by the repetition of such cycle, and the thus generated silver is deposited as a film on the substrate. The electroconductive film (the silver film), namely, the electroconductive film according to the second aspect of the present invention is thereby formed.

The electroconductive film according to the second aspect of the present invention is a film obtained by the electroconductive film-producing method according to the second aspect of the present invention.

The electroconductive film according to the second aspect of the present invention preferably has a volume resistivity of up to $12 \times 10^{-6}$ $\Omega \cdot cm$, and more preferably $10 \times 10^{-6}$ to $8 \times 10^{-6}$ $\Omega \cdot cm$ when the film is the one heat treated at 180° C. for 1 minute.

The electroconductive composition according to the second aspect of the present invention is well adapted for printing since fine lines can be printed with high accuracy, smudging is prevented, and the composition is smoothly comes off the plate and has good printability.

Typical applications of the electroconductive film according to the second aspect of the present invention include an electronic circuit and a circuit of an antenna.

EXAMPLES

Next, the present invention is described in detail by referring to the Examples, which by no means limit the scope of the present invention.

1. Examples of the Electroconductive Composition According to the First Aspect of the Present Invention Examples 1-1 to 1-5

Silver(I) oxide and silver 2-methylpropanoate (silver salt of isobutyric acid) were mixed in α-terpineol at the molar ratio shown in Table 1 to prepare the electroconductive composition. Silver 2-methylpropanoate is the reaction product of 2-methylpropanoic acid (isobutyric acid) which is a aliphatic acid with silver oxide. The number of substitution and the boiling point of the isobutyric acid used in the reaction for producing the silver salt of the aliphatic acid were indicated in Table 1.

Next, the thus prepared electroconductive composition was applied onto a polyethylene terephthalate film substrate having a thickness of 125 μm to form the coating, and this coating was dried at 180° C. for 1 minute or at 180° C. for 30 minutes to produce the electroconductive film. The electroconductive composition was also applied onto a polyimide film substrate (Kapton manufactured by DuPont-Toray Co., Ltd.) having a thickness of 125 μm to form the coating, and this coating was dried at 210° C. for 1 minute to produce the electroconductive film.

Example 1-6

The procedure of Example 1-3 was repeated except that silver 2-methylpropanoate was substituted with silver 2-methylbutanoate which was the reaction product of 2-methylbutanoic acid (2-methylbutyric acid) which is a aliphatic acid with silver oxide to prepare the electroconductive composition, and an electroconductive film was produced using this electroconductive composition. The number of substitution and the boiling point of the 2-methylbutyric acid used in the reaction for producing the silver salt of the aliphatic acid were indicated in Table 1.

Example 1-7

The procedure of Example 1-3 was repeated except that silver 2-methylpropanoate was substituted with silver 2-methylpentanoate which was the reaction product of 2-methylpentanoic acid which is a aliphatic acid with silver oxide to prepare the electroconductive composition, and an electroconductive film was produced using this electroconductive composition. The number of substitution and the boiling point of the 2-methylpentanoic acid used in the reaction for producing the silver salt of the aliphatic acid were indicated in Table 1.

Example 1-8

The procedure of Example 1-3 was repeated except that silver 2-methylpropanoate was substituted with silver 2-methylheptanoate which was the reaction product of 2-methylheptanoic acid which is a aliphatic acid with silver oxide to prepare the electroconductive composition, and an electroconductive film was produced using this electroconductive composition. The number of substitution and the boiling point of the 2-methylheptanoic acid used in the reaction for producing the silver salt of the aliphatic acid were indicated in Table 1.

Example 1-9

The procedure of Example 1-3 was repeated except that silver 2-methylpropanoate was substituted with silver 2-ethylbutanoate which was the reaction product of 2-ethylbutanoic acid which is a aliphatic acid with silver oxide to prepare the electroconductive composition, and an electroconductive film was produced using this electroconductive composition. The number of substitution and the boiling point of the 2-ethylbutanoic acid used in the reaction for producing the silver salt of the aliphatic acid were indicated in Table 1.

Example 1-10

The procedure of Example 1-3 was repeated except that silver neodecanoate prepared by reacting neodecanoic acid which is a aliphatic acid with silver oxide was used at the molar ratio indicated in Table 1 to prepare the electroconductive composition, and an electroconductive film was produced using this electroconductive composition. The number of substitution and the boiling point of the neodecanoic acid used in the reaction for producing the silver neodecanoate were indicated in Table 1.

Comparative Example 1-1

The procedure of Example 1-3 was repeated except that silver 2-methylpropanoate was substituted with silver butyrate which was the reaction product of butanoic acid (butyric acid) which is a aliphatic acid with silver oxide to prepare the electroconductive composition, and an electroconductive film was produced using this electroconductive composition. The number of substitution and the boiling point of the butyric acid used in the reaction for producing the silver salt of the aliphatic acid were indicated in Table 1.

Comparative Example 1-2

The procedure of Example 1-3 was repeated except that silver 2-methylpropanoate was substituted with silver valerate which was the reaction product of pentanoic acid (valeric acid) which is a aliphatic acid with silver oxide to prepare the electroconductive composition, and an electroconductive film was produced using this electroconductive composition. The number of substitution and the boiling point of the valeric acid used in the reaction for producing the silver salt of the aliphatic acid were indicated in Table 1.

Comparative Example 1-3

The procedure of Example 1-3 was repeated except that silver 2-methylpropanoate was substituted with silver phenylisobutyrate which was the reaction product of phenylisobutyric acid which is a aliphatic acid with silver oxide to prepare the electroconductive composition, and an electroconductive film was produced using this electroconductive composition. The number of substitution and the boiling point of the phenylisobutyric acid used in the reaction for producing the silver salt of the aliphatic acid were indicated in Table 1.

Comparative Example 1-4

The procedure of Example 1-3 was repeated except that silver 2-methylpropanoate was substituted with silver 2-methylhexanoate which was the reaction product of 2-methylhexanoic acid which is a aliphatic acid with silver oxide to prepare the electroconductive composition, and an electroconductive film was produced using this electroconductive composition. The number of substitution and the boiling point of the 2-methylhexanoic acid used in the reaction for producing the silver salt of the aliphatic acid were indicated in Table 1.

Comparative Example 1-5

The procedure of Example 1-3 was repeated except that silver 2-methylpropanoate was substituted with silver 2-ethylhexanoate which was the reaction product of 2-ethylhexanoic acid which is a aliphatic acid with silver oxide to prepare the electroconductive composition, and an electroconductive film was produced using this electroconductive composition. The number of substitution and the boiling point of the 2-ethylhexanoic acid used in the reaction for producing the silver salt of the aliphatic acid were indicated in Table 1.

Comparative Example 1-6

The procedure of Example 1-3 was repeated except that silver 2-methylpropanoate was substituted with silver pivalate which was the reaction product of pentanoic acid (pivalic acid) which is a aliphatic acid with silver oxide to prepare the electroconductive composition, and an electroconductive film was produced using this electroconductive composition. The number of substitution and the boiling point of the pivalic acid used in the reaction for producing the silver salt of the aliphatic acid were indicated in Table 1.

Comparative Example 1-7

The procedure of Example 1-3 was repeated except that silver 2-methylpropanoate was substituted with silver neodecanoate which was the reaction product of neodecanoic acid which is a aliphatic acid with silver oxide to prepare the electroconductive composition, and an electroconductive film was produced using this electroconductive composition. The number of substitution and the boiling point of the neodecanoic acid used in the reaction for producing the silver salt of the aliphatic acid were indicated in Table 1.

The resistivity of the resulting electroconductive films was measured by the procedure as described below. The results are shown in Table 1.

<Resistivity>

The electroconductive films obtained by drying under various conditions were evaluated for their resistivity (volume resistivity value) by the 4-terminal method using a low resistivity meter (Loresta GP manufactured by Mitsubishi Chemical Corporation). The results are shown in Table 1, below. In Table 1, "U.M. (unmeasurable)" means that the resistivity could not be measured because of the unfavorable condition of the electroconductive film.

As demonstrated in the results shown in Table 1, each of the electroconductive compositions prepared in Examples 1-1 to 1-10 could be formed into an electroconductive film even when the coating was dried under the condition of 180° C. for 1 minute in contrast to the electroconductive composition of Comparative Example 1-7 corresponding to a prior art composition. In particular, each of the electroconductive compositions prepared in Examples 1-2 to 1-4 containing the silver oxide and the silver salt of a aliphatic acid at a molar ratio within a predetermined range could be formed into an electroconductive film having a favorable resistivity.

2. Examples of the Electroconductive Composition According to the Second Aspect of the Present Invention Examples 2-1 to 2-11 and Comparative Examples 2-1 to 2-4

The components shown in Table 2 were introduced in a ball mill in the amounts shown in Table 2 (unit, g), and the mixture

TABLE 1

(No. 1)

| | | Example | | | | | | | | | |
|---|---|---|---|---|---|---|---|---|---|---|---|
| | | 1-1 | 1-2 | 1-3 | 1-4 | 1-5 | 1-6 | 1-7 | 1-8 | 1-9 | 1-10 |
| Silver oxide (mole) | | 1.00 | 1.00 | 1.00 | 1.00 | 1.00 | 1.00 | 1.00 | 1.00 | 1.00 | 1.00 |
| Aliphatic acid silver salt (mole) (Degree of substitution/ boiling point) | Silver 2-methylpropanoate (Secondary/155° C.) | 0.05 | 0.07 | 0.15 | 0.50 | 2.00 | | | | | 0.15 |
| | Silver 2-methylbutanoate (Secondary/177° C.) | | | | | | 0.15 | | | | |
| | Silver 2-methylpentanoate (Secondary/195° C.) | | | | | | | 0.15 | | | |
| | Silver 2-methylheptanoate (Secondary/190° C.) | | | | | | | | 0.15 | | |
| | Silver 2-ethylbutanoate (Secondary/193° C.) | | | | | | | | | 0.15 | |
| | Silver neodecanoate (Tertiary/270° C.) | | | | | | | | | | 0.025 |
| Silver oxide (mole)/aliphatic acid silver salt (mole) | | 20.0 | 14.3 | 6.7 | 2.0 | 0.5 | 6.7 | 6.7 | 6.7 | 6.7 | 7.8 |
| Terpineol (g) | | 100 | 100 | 100 | 100 | 100 | 100 | 100 | 100 | 100 | 100 |
| Resistivity (×10$^{-6}$ Ω · cm) | | | | | | | | | | | |
| Drying at 180° C. for 1 minute | | 100.2 | 10.2 | 7.5 | 8.8 | 20.5 | 32.2 | 43.0 | 43.7 | 46.2 | 7.9 |
| Drying at 180° C. for 30 minutes | | 80.5 | 8.6 | 7.5 | 8.8 | 15.0 | 22.5 | 31.6 | 37.5 | 39.1 | 7.9 |
| Drying at 210° C. for 1 minute | | 100.2 | 10.2 | 7.5 | 8.8 | 20.0 | 32.2 | 45.0 | 43.7 | 46.2 | 7.9 |

(No. 2)

| | | Comparative Example | | | | | | |
|---|---|---|---|---|---|---|---|---|
| | | 1-1 | 1-2 | 1-3 | 1-4 | 1-5 | 1-6 | 1-7 |
| Silver oxide (mole) | | 1.00 | 1.00 | 1.00 | 1.00 | 1.00 | 1.00 | 1.00 |
| Aliphatic acid silver salt (mole) (Degree of substitution/ boiling point) | Silver butyrate (Primary/164° C.) | 0.15 | | | | | | |
| | Silver valerate (Primary/186° C.) | | 0.15 | | | | | |
| | Silver phenylisobutyrate (Secondary/ in excess of 200° C.) | | | 0.15 | | | | |
| | Silver 2-methylhexanoate (Secondary/ 226° C.) | | | | 0.15 | | | |
| | Silver 2-ethylhexanoate (Secondary/ 227° C.) | | | | | 0.15 | | |
| | Silver pivalate (Tertiary/164° C.) | | | | | | 0.15 | |
| | Silver neodecanoate (Tertiary/270° C.) | | | | | | | 0.15 |
| Silver oxide (mole)/aliphatic acid silver salt (mole) | | 6.7 | 6.7 | 6.7 | 6.7 | 6.7 | 6.7 | 6.7 |
| Terpineol (g) | | 100 | 100 | 100 | 100 | 100 | 100 | 100 |
| Resistivity (×10$^{-6}$ Ω · cm) | | | | | | | | |
| Drying at 180° C. for 1 minute | | U.M. | U.M. | U.M. | U.M. | U.M. | U.M. | U.M. |
| Drying at 180° C. for 30 minutes | | U.M. | U.M. | U.M. | U.M. | U.M. | U.M. | 20.0 |
| Drying at 210° C. for 1 minute | | U.M. | U.M. | U.M. | U.M. | U.M. | U.M. | U.M. | was kneaded for 24 hours while the solid silver oxide was pulverized. The electroconductive composition was thereby prepared.

The resulting electroconductive compositions were evaluated for their thixotropic index and volume resistivity by the procedure as described below.

(1) Thixotropic Index

The resulting electroconductive compositions were measured for their viscosity under the condition of 23° C. and an RH (relative humidity) of 65% by using a model E viscometer with a cone angle of 3° to measure the viscosity at rotation speeds of 1 rpm and 10 rpm. The thixotropic index was determined from the ratio of the viscosity at 1 rpm to the viscosity at 10 rpm (viscosity at 1 rpm/viscosity at 10 rpm). The results are shown in Table 2.

(2) Volume Resistivity

The substrate used was a PET film (trade name, Lumirror S56, manufactured by Toray Industries, Inc.) having a thickness of 125 μm, and the resulting electroconductive composition was applied to this substrate by screen printing. The composition was dried at 180° C. for 1 minute to thereby form a film and produce a sample having the film deposited thereon. Using the resulting sample, the volume resistivity of the film was measured by the 4-terminal method using a low resistivity meter (Loresta GP manufactured by Mitsubishi Chemical Corporation).

Another sample was prepared by using a polyimide film (Kapton manufactured by DuPont-Toray Co., Ltd.) having a thickness of 125 μm for the substrate, and drying the composition under a different condition of 210° C. for 1 minute. The volume resistivity of the film formed was measured.

The results are shown in Table 2.

In Table 2, "U.M. (unmeasurable)" means that the volume resistivity could not be measured because the composition was not formed into a film.

TABLE 2

(No. 1)

|  |  | Example 2-1 | Example 2-2 | Example 2-3 | Example 2-4 | Example 2-5 | Example 2-6 | Example 2-7 | Example 2-8 |
|---|---|---|---|---|---|---|---|---|---|
| Silver oxide |  | 100 | 100 | 100 | 100 | 100 | 100 | 100 | 100 |
| Secondary aliphatic acid silver salt |  | 5.0 | 5.0 | 5.0 | 5.0 | 5.0 | 5.0 | 5.0 | 5.0 |
| Aliphatic acid silver salt |  | 4.5 |  |  |  |  |  |  |  |
| Aliphatic acid | Stearic acid |  | 10.0 | 3.3 | 1.7 |  |  |  |  |
|  | Palmitic acid |  |  |  |  | 3.3 |  |  |  |
|  | Myristic acid |  |  |  |  |  | 3.3 |  |  |
|  | Lauric acid |  |  |  |  |  |  | 3.3 |  |
|  | Capric acid |  |  |  |  |  |  |  | 3.3 |
|  | Caprylic acid |  |  |  |  |  |  |  |  |
|  | Aliphatic acid 1 |  |  |  |  |  |  |  |  |
|  | Pentanoic acid |  |  |  |  |  |  |  |  |
|  | Aliphatic acid 2 |  |  |  |  |  |  |  |  |
|  | Aliphatic acid 3 |  |  |  |  |  |  |  |  |
| Solvent |  | 30.0 | 30.0 | 30.0 | 30.0 | 30.0 | 30.0 | 30.0 | 30.0 |
| Thixotropic index (1 rpm/10 rpm) |  | 13.0 | 10.2 | 6.2 | 5.1 | 5.6 | 5.0 | 5.0 | 5.8 |
| Volume resistivity ($\times 10^{-6}$ Ω · cm) |  |  |  |  |  |  |  |  |  |
| Drying at 180° C. for 1 minute |  | 9.2 | 11.2 | 9.1 | 8.6 | 9.7 | 9.2 | 9.3 | 8.9 |
| Drying at 210° C. for 1 minute |  | 9.2 | 11.2 | 9.1 | 8.6 | 9.7 | 9.2 | 9.3 | 8.9 |

(No. 2)

|  |  | Example 2-9 | Example 2-10 | Example 2-11 | Comparative Example 2-1 | Comparative Example 2-2 | Comparative Example 2-3 | Comparative Example 2-4 |
|---|---|---|---|---|---|---|---|---|
| Silver oxide |  | 100 | 100 | 100 | 100 | 100 | 100 | 100 |
| Secondary aliphatic acid silver salt |  | 5.0 | 5.0 | 5.0 | 5.0 | 5.0 | 5.0 | 5.0 |
| Aliphatic acid silver salt |  |  |  |  |  |  |  |  |
| Aliphatic acid | Stearic acid |  |  |  | 1.3 |  |  |  |
|  | Palmitic acid |  |  |  |  |  |  |  |
|  | Myristic acid |  |  |  |  |  |  |  |
|  | Lauric acid |  |  |  | 0.9 |  |  |  |
|  | Capric acid |  |  |  |  |  |  |  |
|  | Caprylic acid | 3.3 |  |  |  |  |  |  |
|  | Aliphatic acid 1 |  | 3.3 |  |  |  |  |  |
|  | Pentanoic acid |  |  |  |  | 3.3 |  |  |
|  | Aliphatic acid 2 |  |  |  |  |  | 3.3 |  |
|  | Aliphatic acid 3 |  |  |  |  |  |  | 3.3 |
| Solvent |  | 30.0 | 30.0 | 30.0 | 30.0 | 30.0 | 30.0 | 30.0 |
| Thixotropic index (1 rpm/10 rpm) |  | 5.1 | 5.0 | 7.0 | 2.9 | 3.1 | 3.2 | 3.0 |
| Volume resistivity ($\times 10^{-6}$ Ω · cm) |  |  |  |  |  |  |  |  |
| Drying at 180° C. for 1 minute |  | 8.9 | 9.4 | 8.7 | 8.6 | U.M. | U.M. | U.M. |
| Drying at 210° C. for 1 minute |  | 8.9 | 9.4 | 8.7 | 8.6 | U.M. | U.M. | U.M. |

The components shown in Table 2 are as described below.
Silver oxide: manufactured by Toyo Chemical Industrial Co., Ltd. This silver oxide was also used for the preparation of other compositions.
Silver salt of a secondary aliphatic acid: silver 2-methylpropanoate manufactured by adding 30.5 g of 2-methylpropanoic acid (manufactured by Kanto Chemical Co., Inc.) and 40 g of silver oxide to 60 g of α-terpineol (manufactured by Tokyo Chemical Industry Co., Ltd.), and kneading the mixture in a ball mill for 12 hours.
Silver salt of a aliphatic acid: silver stearate manufactured by adding 97 g of stearic acid (manufactured by Kanto Chemical Co., Inc.) and 40 g of silver oxide to 60 g of α-terpineol (manufactured by Tokyo Chemical Industry Co., Ltd.), and kneading the mixture in a ball mill for 12 hours.
Stearic acid: manufactured by Kanto Chemical Co., Inc.
Palmitic acid: manufactured by Wako Pure Chemical Industries, Ltd.
Myristic acid: manufactured by Wako Pure Chemical Industries, Ltd.
Lauric acid: manufactured by Kanto Chemical Co., Inc.
Capric acid: trade name LUNAC10-98, manufactured by Kao Corporation.
Caprylic acid: trade name LUNAC8-98, manufactured by Kao Corporation.
Aliphatic acid 1: Rikacid BT-W manufactured by New Japan Chemical Co., Ltd. which is a compound represented by the following formula (6):

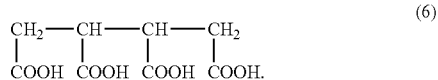

Pentanoic acid: manufactured by Kanto Chemical Co., Inc.
Aliphatic acid 2: Rikacid TH-W manufactured by New Japan Chemical Co., Ltd. which is a compound represented by the following formula (7):

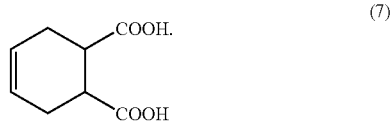

Aliphatic acid 3: Rikacid HH-W manufactured by New Japan Chemical Co., Ltd. which is a compound represented by the following formula (8):

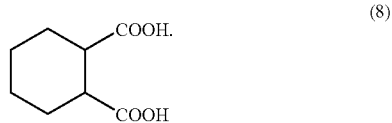

Solvent: α-terpineol, manufactured by Tokyo Chemical Industry Co., Ltd.

As evident from the results shown in Table 2, the composition of Comparative Example 2-1 containing no aliphatic acid containing at least 8 carbon atoms (C1) and/or no aliphatic acid silver salt (C2) whose aliphatic acid contains at least 8 carbon atoms was inferior in its thixotropy.

In addition, the composition of Comparative Example 2-2 containing the aliphatic acid containing less than 8 carbon atoms and the compositions of Comparative Examples 2-3 and 2-4 each containing a compound other than the aliphatic acid containing at least 8 carbon atoms were inferior in their thixotropy, and could not be formed into a film.

In contrast, the compositions of Examples 2-1 to 2-11 had an excellent thixotropy, and the film obtained by conducting the heat treatment at a low temperature for a short time exhibited a reduced electric resistance.

What is claimed is:

1. An electroconductive composition comprising:
   (A) silver oxide; and
   (B) a secondary aliphatic acid silver salt produced by using a secondary aliphatic acid having a boiling point of not higher than 200° C.

2. The electroconductive composition according to claim 1, wherein a ratio of a number of moles A of the silver oxide (A) to a number of moles B of the secondary aliphatic acid silver salt (B) (molar ratio A/B) is in a range of 2/1 to 15/1.

3. The electroconductive composition according to claim 1, wherein the secondary aliphatic acid silver salt (B) is silver 2-methylpropanoate.

4. An electroconductive film-producing method comprising the steps of:
   applying the electroconductive composition of claim 1 onto a substrate to form a coating; and
   subjecting the coating to a heat treatment to produce an electroconductive film.

5. The electroconductive film-producing method according to claim 4, wherein the heat treatment is conducted by heating the coating to a temperature of 100 to 250° C.

6. An electroconductive composition comprising:
   (A) silver oxide;
   (B') a secondary aliphatic acid silver salt whose secondary aliphatic acid contains up to 7 carbon atoms;
   (C1) a linear or branched aliphatic acid containing at least 8 carbon atoms and/or (C2) a aliphatic acid silver salt whose aliphatic acid contains at least 8 carbon atoms; and
   (D) a solvent.

7. The electroconductive composition according to claim 6, wherein a ratio of a total weight of the silver oxide (A) and the secondary aliphatic acid silver salt whose secondary aliphatic acid contains up to 7 carbon atoms (B') to a weight of the linear or branched aliphatic acid containing at least 8 carbon atoms (C1) and/or the linear or branched aliphatic acid silver salt (C2) whose aliphatic acid contains at least 8 carbon atoms is in a range of 100/0.5 to 100/20.

8. The electroconductive composition according to claim 6, wherein the secondary aliphatic acid silver salt whose secondary aliphatic acid contains up to 7 carbon atoms (B') is silver 2-methylpropanoate.

9. The electroconductive composition according to claim 6, wherein the solvent (D) is α-terpineol.

10. An electroconductive film-producing method comprising the steps of:
    applying the electroconductive composition of claim 4 onto a substrate to form a coating; and
    subjecting the coating to a heat treatment to produce an electroconductive film.

11. The electroconductive film-producing method according to claim 10, wherein the heat treatment is conducted by heating the coating to a temperature of 100 to 250° C.

* * * * *